United States Patent
Versen et al.

(10) Patent No.: US 7,339,841 B2
(45) Date of Patent: Mar. 4, 2008

(54) TEST MODE METHOD AND APPARATUS FOR INTERNAL MEMORY TIMING SIGNALS

(75) Inventors: Martin Versen, Feldkirchen-Westerham (DE); Klaus Nierle, Essex Junction, VT (US); Oliver Kiehl, Charlotte, VT (US); Ernst Stahl, Essex Junction, VT (US)

(73) Assignee: Infineon Technologies AG (DE)

( * ) Notice: Subject to any disclaimer, the term of this patent is extended or adjusted under 35 U.S.C. 154(b) by 335 days.

(21) Appl. No.: 11/227,099

(22) Filed: Sep. 16, 2005

(65) Prior Publication Data
US 2007/0064505 A1 Mar. 22, 2007

(51) Int. Cl.
*G11C 7/00* (2006.01)

(52) U.S. Cl. ............................. 365/194; 365/201

(58) Field of Classification Search ............... 365/194, 365/201, 191, 230.06, 230.08, 189.08
See application file for complete search history.

(56) References Cited

U.S. PATENT DOCUMENTS

| | | | |
|---|---|---|---|
| 5,148,398 A | 9/1992 | Kohno | |
| 5,537,351 A * | 7/1996 | Suwa et al. | 365/189.02 |
| 6,286,118 B1 | 9/2001 | Churchill et al. | |
| 6,304,510 B1 * | 10/2001 | Nobunaga et al. | 365/230.06 |
| 6,317,373 B1 | 11/2001 | Tanimura | |
| 6,684,356 B2 | 1/2004 | Raad et al. | |
| 6,865,702 B2 * | 3/2005 | Roohparvar | 714/718 |
| 7,082,075 B2 * | 7/2006 | Skidmore | 365/230.03 |

* cited by examiner

*Primary Examiner*—Son Dinh
*Assistant Examiner*—Hien Nguyen
(74) *Attorney, Agent, or Firm*—Edell, Shapiro & Finnan, LLC

(57) ABSTRACT

A method of testing internal signals of a memory for timing marginalities which may result in unstable operation includes: delaying internal address signals of the memory by an amount great enough so that data cannot be validly written to and read from memory locations which are accessed by address signals having timing marginalities which are delayed but small enough so that data can be validly written to and read from memory locations which are accessed by address signals not having such timing marginalities which are delayed. Data is then written to and read from memory locations which are accessed by delayed address signals, and a determination is made as to whether the data read from any memory location does not correspond with the data written to such memory location.

25 Claims, 3 Drawing Sheets

TEST MODE METHOD AND APPARATUS FOR INTERNAL MEMORY TIMING SIGNALS

FIELD OF THE INVENTION

The invention relates to the testing of random access memories (RAMs), and particularly to testing for internal timing signal marginalities.

BACKGROUND OF THE INVENTION

Before memory devices can be delivered to customers, they must be tested to guarantee their functionality. Tests may relate to a number of parameters, such as operation over a range of voltages, temperatures, and frequencies, and a certain guard band may be built into the tests to ensure memory chips will not fail if operated beyond their specifications for short periods of time.

The testing is part of the manufacturing process, and can be quite time consuming. Any reduction in the time that it takes to test memories is a savings in manufacturing cost, and is therefore desirable. Internal timing marginalities are one source of potential failure for memory chips. Unfortunately, parametric timing and voltage deviations induced by noise cannot be controlled reliably. Thus, the internal set up times for addresses are not controllable parameters for memories, including the present generation of semiconductor dynamic random access memories (DRAMs). Especially high density DRAMs require a long signal path that is very susceptible to noise.

To ensure proper operation under conditions in application settings, memory devices are often tested under specific conditions that mimic those expected to occur during operation in particular applications required by customers. Due to slight timing fluctuations, internal timing marginalities of address and control signals can cause sporadic memory device failures during such application testing. With prior art testing it is very time consuming and expensive to test for noise induced functional marginalities. Thus, it would be desirable to facilitate the testing of marginal internal address and control signal setup times and identification of those timing signals which are problematic.

SUMMARY OF THE INVENTION

In accordance with the present invention, a method of testing internal signals of a memory for timing marginalities which may result in unstable operation is provided which comprises delaying internal address signals of the memory by an amount great enough so that data cannot be validly written to and read from memory locations which are accessed by address signals which have timing marginalities which are delayed but small enough so that data can be validly written to and read from memory locations which are accessed by address signals which do not have such timing marginalities which are delayed, writing to and reading data from memory locations which are accessed by delayed address signals, and determining whether the data read from any memory location does not correspond with the data written to such memory location.

BRIEF DESCRIPTION OF THE DRAWINGS

The invention will be better understood by referring to the accompanying drawings wherein.

DETAILED DESCRIPTION

Figure 1:
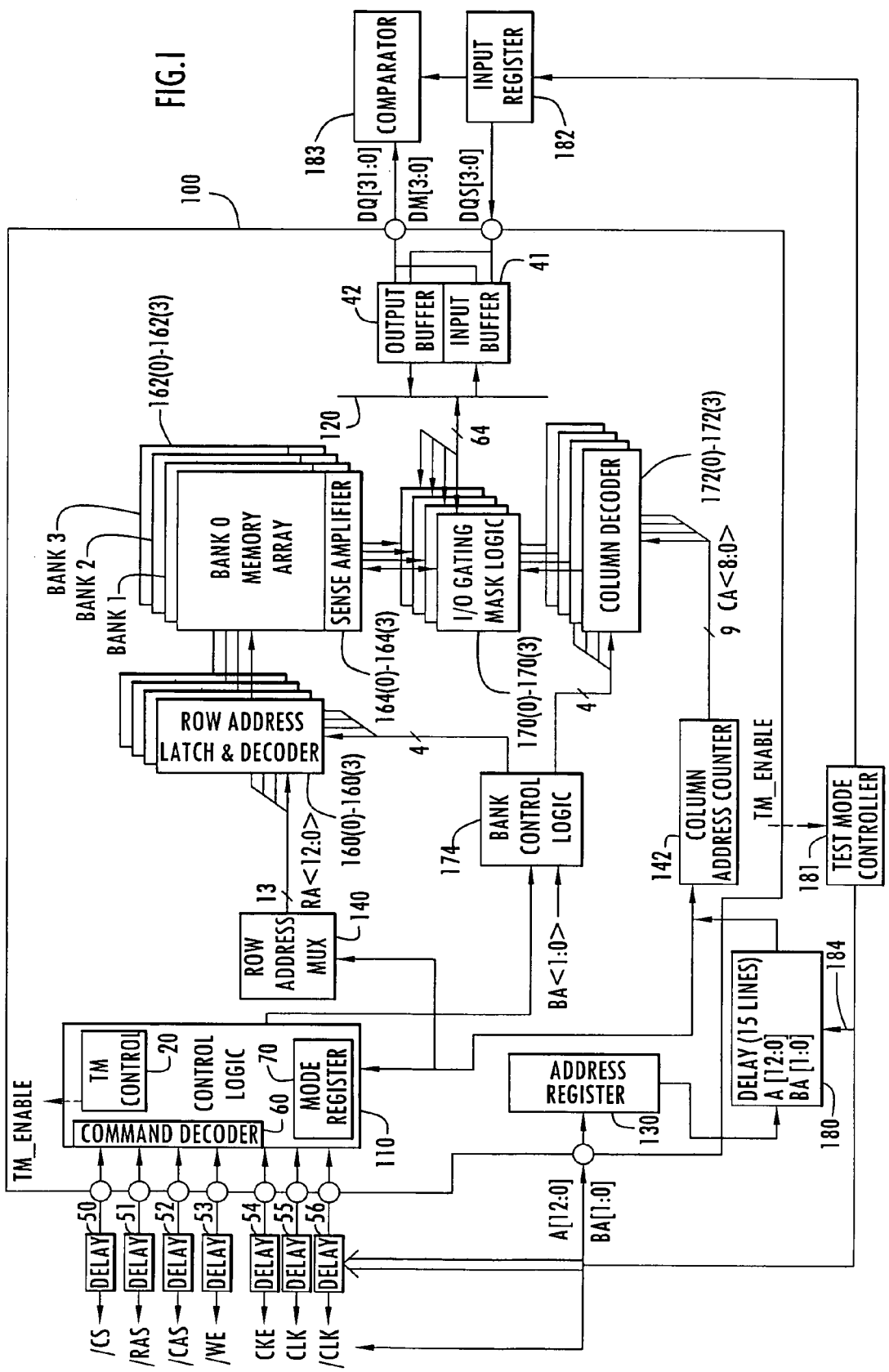
FIG. 1 is a block diagram of a memory which incorporates an embodiment of the invention.

Referring first to FIG. 1, a block diagram of an embodiment of the invention is shown in the context of a 512 Mbyte Double Data Rate (DDR) semiconductor synchronous dynamic random access memory (SDRAM). It should be understood that the system and methods described herein may be useful in any type of semiconductor memory device. FIG. 1 illustrates a memory device 100 and its components that are relevant to the test mode system described herein. Other components not shown in FIG. 1 may be present depending on the type of memory device.

The components of the test mode system shown in FIG. 1 are delay lines 180 and 50 to 56 inclusive, test mode controller 181, register 182, and comparator 183. There also may be included a test mode (TM) enable control circuit 20. Parameters for controlling the test mode system may be stored in a mode register 70. These components interact with other components that are common to most semiconductor memory devices. For example, the TM enable control circuit 20 may be included as part of a control logic block 110 that also includes the mode register 70 and a command decoder 60. The register 82 and comparator 183 are coupled to a bus 120 that in turn connects to various other components in the memory device.

The memory device 100 further includes an address register 130 that is connected to the control logic block 110, a row address multiplexer (MUX) 140 and a column address counter 142. There is a plurality of row address latch and decoder blocks 160(0) to 160(3), each of which is associated with a corresponding memory array bank 162(0) to 162(3). In addition, associated with each bank 162(0) to 162(3) is a corresponding sense amplifier block 164(0) to 164(3). Furthermore, there are input/output (I/O) gating mask logic blocks 170(0) to 170(3) for a corresponding memory array bank, and a column decoder 172(0) to 172(3) for a corresponding I/O gating mask logic block. The column decoders 172(0) to 172(3) are controlled by outputs from the column address counter 142 and a bank control logic circuit 174.

The bus 120 connects, among other components, the input buffer 41 and output buffer 42 to the I/O gating mask logic blocks 170(0) to 170(3). Input register 182 is connected to input buffer 41 while comparator 183 is connected to the output buffer 42. As a result, the data stored in the register 182 can be written to one of the memory array banks 162(0) to 162(3), and subsequently the contents read from one of the memory array banks 162(0) to 162(3) can be coupled to the comparator 183 for error checking operations.

Figure 2:
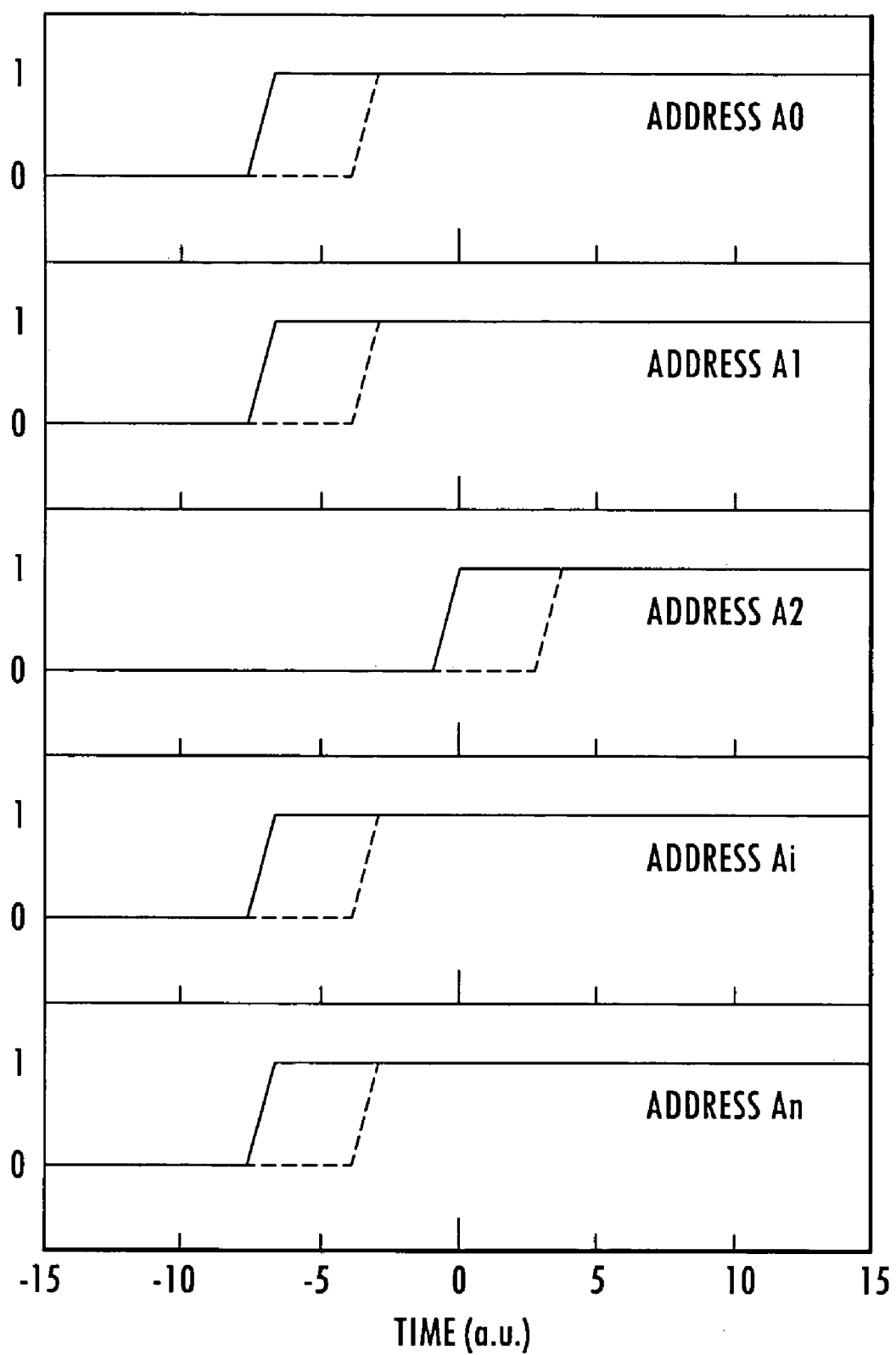
FIG. 2 is a timing diagram which illustrates the principle of the invention.

The principle of the invention is illustrated in FIG. 2, which shows voltage levels of internal address A0, A1, A2 . . . Ai to An lines in arbitrary units. The latch position for the addresses is assumed to be at time 0.

A marginal address signal such as A2 will fail intermittently and give unstable test results. However, if the signal is delayed by a certain amount, as depicted by the dotted lines in the Figure, the result will be a stable and reliable fail. The amount of the delay is great enough so that a fail indication will be produced for a marginal timing signal, but small enough so that a pass indication will be produced for a timing signal which is not marginal. Thus, in FIG. 2, a fail indication would be produced only for Address A2, while addresses A0, A1, Ai, and An would all produce pass indications.

A test mode circuitry, an example of which is shown in FIG. 1 allows delaying the timing of a single address line at a time. The selection of which address line is delayed is done by a soft set selection during the test mode set. This results in activating a delay line in series with the address line, which during normal operation of the memory is inactive.

Referring again to FIG. 1, in the operation of the test mode system, bits stored in mode register 70 may cause test mode enable control 20 to generate a TM_ENABLE signal which is fed to test mode controller 181 to initiate operation. The test mode controller causes successive address signals to be produced. The pattern for such signals may either be programmed into mode register 70 or in test mode controller 181 itself. The signals are fed to address register 130, and at the same time test mode controller 181 activates delay line 180 on line 184. Thus, the address signals outputted from address register 130 are delayed by an amount great enough so that data cannot be validly written to and read from memory locations accessed by address signals having timing marginalities which are delayed but small enough so that data can be validly written to and from memory locations which are accessed by address signals not having such timing marginalities which are delayed.

While delay line 180 is depicted as a single unit, in an actual embodiment it would be comprised of a plurality of delay lines, each connected to a different line feeding out of register 130, all set with the same delay. It is noted that in the specific memory illustrated, multiplexing is used, meaning that successive address signals outputted from address register 130 will address row then column or vice versa. Thus, delay line 180 is connected before multiplexer 140 and column address counter 142 so that both row and column address signals may be delayed.

The testing procedure involves delaying one of the row or column address signals for a given memory location, writing data to the location through input register 182 and input buffer 41, storing the data and the location of the delayed address signal in register 182 reading the data through output buffer 42, and using comparator 183 to determine if the data read corresponds to the data written. If not, comparator 183 provides the location of the faulty address signal. The row address signals and column address signals are tested separately from each other, so the exact address signal which is problematic can be identified. Typically, data would be written to all memory locations being used in the test using delayed address signals and then the data would be read from all locations written to. The data written may be both high and low data.

In a complete version of a memory test, each location would be written to and read from using both high and low data. In a more limited version of the test, some selected subset of memory locations would be written to, using high data, low data, or both. The memory locations may be tested in order, randomly, or according to a predetermined program. In a memory of the type shown in FIG. 1, a row may be opened up and the columns successively tested. If desired, a baseline test may first be performed in which no delays are used.

The method and apparatus of the invention may also be used to test for timing marginalities in the control signals of the memory. In this regard delay lines 50 to 56 inclusive are depicted in FIG. 1 for delaying control signals including row address strobe (/RAS), column address strobe (/CAS), and write or read enable (/WE). The specific memory depicted has four additional control signals denoted as /CS, CKE, CLK and /CLK, and these also may be tested. The test mode controller 181 may arrange for the generation of such signals as well as for the activation of delay lines 50 to 56. Such control signals only need to be tested once each. It is necessary to read and write to only a single memory location.

Figure 3:
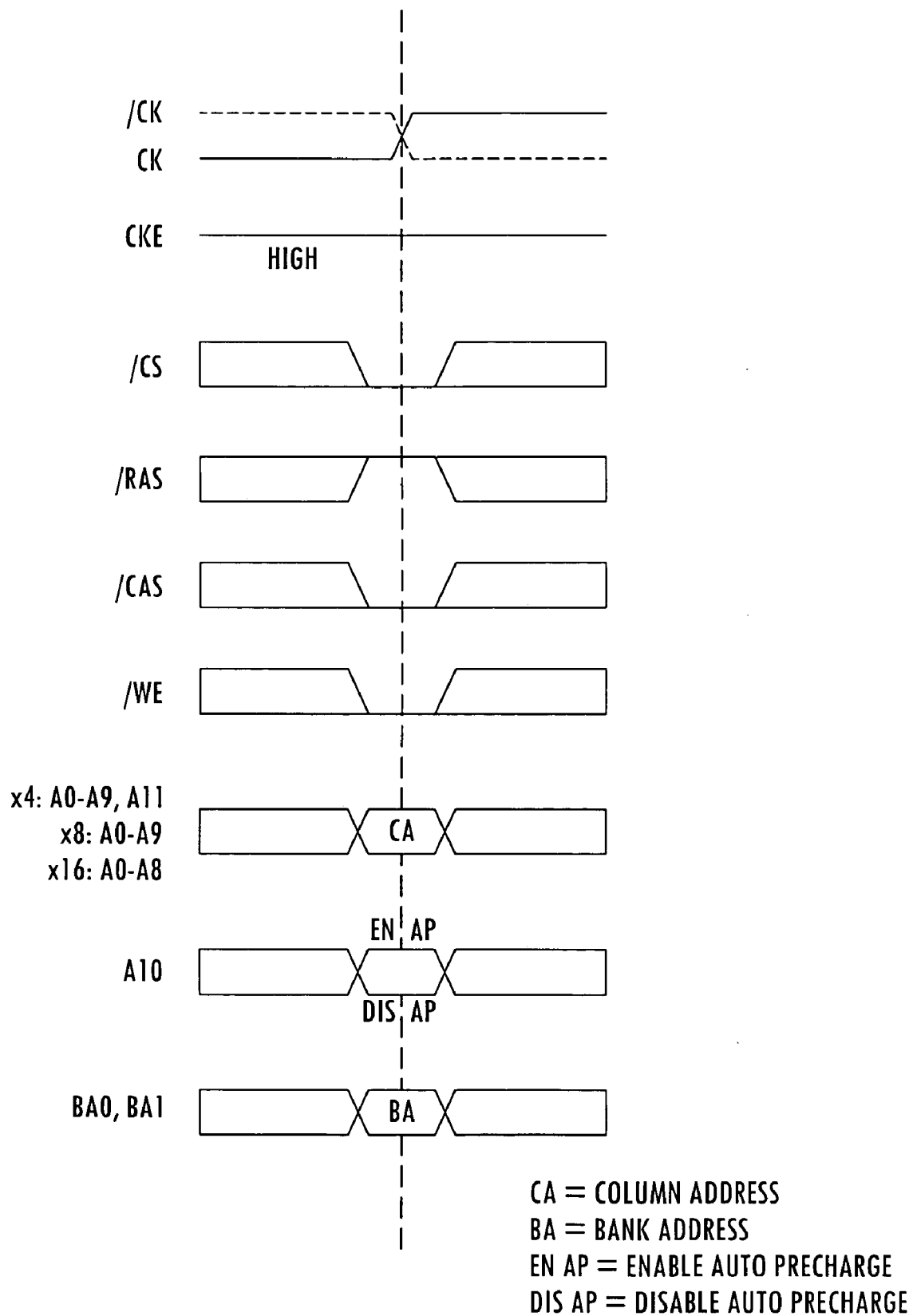
FIG. 3 is a timing diagram for writing data to the memory of FIG. 1.

The control signals for executing a write command are shown in FIG. 3. A differential clock (CK and /CK) is used. The crossing of CK going high and /CK going low is referred to as the positive edge of CK. Commands (address and control signals) are registered at every positive edge of CK. The control signals shown in FIG. 3 would be delayed in the same manner shown in connection with FIG. 2 and discussed above to achieve testing for timing marginalities. The enable and disable Auto Precharge signals shown in FIG. 3 refer to the charging of memory cells which occur in the SDRAM depicted.

It should be noted that the delay lines used are preferably programmable, that is, the amount of the delay is controllable either by bits in mode register 70 or by programming in test mode controller 181. The delay lines may have taps which control the amount of the delay. The circuitry of the delay lines is well known to those skilled in the art, and for example may be based on the use of inverters. Alternatively, the chips themselves may have built in delay lines. If built in delay lines are used, external delay lines are not necessary and only control logic needs to be added. Some chips may have metal or global fuse options, which are generally set and not programmable.

The method and apparatus of the invention may be capable of testing a memory for internal timing marginalities within several seconds. It has been found that when memories are tested in application settings, over a period of several days failures tend to occur. Such failures may be due to internal timing marginalities, and the testing for such problems is facilitated by the present invention.

Therefore, in accordance with the present invention a method of testing internal signals of a memory for timing marginalities which may result in unstable operation is provided which comprises delaying internal address signals of the memory by an amount great enough so that data cannot be validly written to and read from memory locations which are accessed by address signals having timing marginalities which are delayed but small enough so that data can be validly written to and read from memory locations which are accessed by address signals not having such timing marginalities which are delayed, writing to and reading data from memory locations which are accessed by delayed address signals, and determining whether the data read from any memory location does not correspond with the data written to such memory location.

Also, an apparatus for testing internal signals of a memory for timing marginalities which may result in unstable operation is provided which comprises a plurality of delay lines operably connected so as to delay internal address signals of the memory by an amount great enough so that data cannot be validly written to and read from memory locations which are accessed by address signals having timing marginalities which are delayed but small enough so that data can be validly written to and read from memory locations which are accessed by address signals not having such timing marginalities which are delayed, whereby timing marginalities of internal address signals can be characterized.

Additionally, a test mode apparatus for a memory which data is written to and read from is provided which comprises a plurality of delay lines operably connected so as to delay internal address signals of the memory resulting in delayed address signals, a controller for controlling the sequence of accessing memory locations with delayed address signals, a register for storing data written to memory locations, and a comparator for comparing the data written to memory locations, with data read from such memory locations.

It should be understood that while the invention has been described in detail and with reference to specific embodiments thereof, it will be apparent to one skilled in the art that various changes and modifications can be made therein without departing from the spirit and scope thereof. Accordingly, it is intended that such modifications and variations of the invention be covered provided they come within the scope of the appended claims and their equivalents.

We claim:

1. A method of testing internal signals of a memory for timing marginalities which may result in unstable operation, comprising:

delaying internal address signals of the memory by an amount great enough so that data cannot be validly written to and read from memory locations which are accessed by address signals having timing marginalities which are delayed but small enough so that data can be validly written to and read from memory locations which are accessed by address signals not having such timing marginalities which are delayed;

writing to and reading data from said memory locations which are accessed by delayed address signals; and determining whether the data read from any memory location does not correspond with the data written to such memory location.

2. The method of claim 1 wherein if the data read from any memory location does not correspond to the data written to such memory location, determining the identity of the delayed address signal which caused such lack of correspondence to occur.

3. The method of claim 1 wherein row address signals for memory locations are delayed independently of column address signals for such memory locations, and wherein data is written to and read from the memory after the row address signal corresponding to a given memory location is delayed and also after the column address signal corresponding to the memory location is delayed.

4. The method of claim 1 wherein data written to memory locations accessed by delayed address signals comprises both high bits and low bits.

5. The method of claim 1 wherein control signals including those performing the functions of row address strobe, column address strobe, and write or read enable are independently delayed, and data is written to and read from the memory after each such signal is delayed to test the timing marginality of the control signals.

6. A method of testing internal signals of a memory for timing marginalities which may result in unstable operation, comprising:

delaying internal address signals of the memory by an amount great enough so that data cannot be validly written to and read from memory locations which are accessed by address signals having timing marginalities which are delayed but small enough so that data can be validly written to and read from memory locations which are accessed by address signals not having such timing marginalities which are delayed;

writing to and reading data from said memory locations which are accessed by delayed address signals;

comparing the read data from each said memory location with the data written to such memory location; and if the data read from any memory location does not correspond with the data written to said memory location, determining the identity of the delayed address signal which caused such lack of correspondence to occur.

7. The method of claim 6 wherein row address signals for memory locations are delayed independently of column address signals for such memory locations, and wherein data is written to and read from the memory after the row address signal corresponding to a given memory location is delayed and also after the column address signal corresponding to the memory location is delayed.

8. The method of claim 6 wherein data written to memory locations accessed by delayed address signals comprises both high bits and low bits.

9. The method of claim 6 wherein control signals including those performing the functions of row address strobe, column address strobe, and write or read enable are independently delayed, and data is written to and read from the memory after each such signal is delayed to test the timing marginality of the control signals.

10. The method of claim 6 wherein address signals corresponding to each memory location of the memory are tested.

11. An apparatus for testing internal signals of a memory for timing marginalities which may result in unstable operation, comprising:

a plurality of delay lines operably connected so as to delay internal address signals of the memory by an amount great enough so that data cannot be validly written to and read from memory locations which are accessed by address signals having timing marginalities which are delayed but small enough so that data can be validly written to and read from memory locations which are accessed by address signals not having such timing marginalities which are delayed, whereby timing marginalities of internal address signals can be characterized.

12. The apparatus of claim 11 wherein a plurality of additional delay lines are operably connected so as to delay control signals including those performing the functions of row address strobe, column address strobe and write or read enable, whereby timing marginalities of such control signals may be characterized.

13. The apparatus of claim 12 further comprising a register for storing data written to memory locations accessed by address signals having delay lines operably connected therewith.

14. The apparatus of claim 13 further comprising a comparator for comparing stored data with data read from memory locations accessed by address signals having delay lines operably connected therewith.

15. The apparatus of claim 14 wherein said delay lines comprise programmable delay lines.

16. A test mode apparatus for a memory which data is written to and read from comprising a plurality of delay lines operably connected so as to delay internal address signals of the memory resulting in delayed address signals, a controller for controlling the sequence of accessing memory locations with delayed address signals, a register for storing data written to memory locations and a comparator for comparing said data written to memory locations with data read from such memory locations.

17. The apparatus of claim 16 further comprising a plurality of additional delay lines operably connected so as to delay control signals including those performing the functions of row address strobe, column address strobe and read or write enable.

18. The apparatus of claim 15 wherein said controller determines whether a high or low bit is to be written to individual memory locations.

19. The apparatus of claim 16 wherein the delay lines are programmable.

20. The apparatus of claim 19 wherein the controller determines the amount of the delay inserted by the programmable delay lines.

21. An apparatus for testing internal signals of a memory for timing marginalities which may result in unstable operation, comprising:

means for delaying internal address signals of the memory by an amount great enough so that data cannot be validly written to and read from memory locations which are accessed by address signals having timing marginalities which are delayed but small enough so that data can be validly written to and read from memory locations which are accessed by address signals not having such timing marginalities which are delayed;

means for writing to and reading data from said memory locations which are accessed by delayed address signals; and means for determining whether the data read from any memory location does not correspond with the data written to such memory location.

22. The apparatus of claim 21 further comprising means for determining the identity of the delayed address signal which caused a lack of correspondence of the data written to any memory location with the data read from the memory location.

23. The apparatus of claim 21 further comprising means for delaying row address signals for memory locations independently of column address signals for such memory locations.

24. The apparatus of claim 21 further comprising means for writing both high and low bits to memory locations accessed by delayed address signals.

25. The method of claim 21 further comprising means for independently delaying respective control signals including those performing the functions of row address strobe, column address strobe and write or read enable.

* * * * *